United States Patent [19]

Okamoto

[11] Patent Number: 4,893,092
[45] Date of Patent: Jan. 9, 1990

[54] OPERATIONAL AMPLIFIER CIRCUIT
[75] Inventor: Toshiyuki Okamoto, Tokyo, Japan
[73] Assignee: NEC Corporation, Japan
[21] Appl. No.: 252,396
[22] Filed: Sep. 30, 1988
[30] Foreign Application Priority Data
  Oct. 2, 1987 [JP] Japan ................................ 62-250520
[51] Int. Cl.⁴ .............................................. H03F 3/45
[52] U.S. Cl. ..................................... 330/253; 330/260; 330/261
[58] Field of Search ............... 330/253, 255, 260, 261, 330/294
[56] References Cited
U.S. PATENT DOCUMENTS
  4,371,843  2/1983  Fang et al. ...................... 330/260 X Primary Examiner—James B. Mullins
Attorney, Agent, or Firm—Laff, Whitesel, Conte & Saret

[57] ABSTRACT

The operational amplifier circuit comprises a differential amplifier input stage for producing an amplified signal on the basis of an input voltage signal supplied thereto, an output stage for producing an output signal on the basis of the inverting voltage signal, biasing circuit operative to control the amounts of current respectively flowing through the input stage and the output stage, a phase compensating circuit for elimination of distortion in the amplified signal due to a noise on the power voltage, and a phase compensation supporting circuit for restriction of the variation of the amplified signal in a high-frequency operation.

10 Claims, 2 Drawing Sheets

PRIOR-ART

OPERATIONAL AMPLIFIER CIRCUIT

FIELD OF THE INVENTION

This invention relates to an operational amplifier circuit and, more particularly, to an operational amplifier circuit provided with a differential amplifier input stage and an output stage.

BACKGROUND OF THE INVENTION

A typical example of the operational amplifier circuit is illustrated in FIG. 1 of the drawings and largely comprises a differential amplifier input stage 1, an output stage 2, a phase compensating circuit 3 and a biasing circuit 4. The differential amplifier input stage 1 is coupled between two voltage sources Vdd and Vss producing respective voltage levels different in value and has a pair of input transistors 5 and 6 the gate electrodes of which are coupled to an inverting input node 7 and a non-inverting input node 8, respectively. The inverting input node 7 is supplied with a ground voltage level and the non-inverting input node 8 is applied with an input voltage signal. The differential amplifier input stage 1 further has two load transistors 9 and 10 coupled in parallel between the voltage source Vdd and the input transistors 5 and 6, and a current source transistor 11 coupled between the input transistors 5 and 6 and the voltage source Vss for supplying a a constant current to the input transistors 5 and 6. The transistors 5, 6 and 11 are of the n-channel type but the transistors 9 and 10 are formed by p-channel type field effect transistors, respectively. A node shared by the transistors 6 and 10 serves as an output node of the differential amplifier input stage 1. The differential amplifier input stage 1 thus arranged is responsive to a difference in voltage level between the inverting input node 7 and the non-inverting input node 8, and the difference in voltage level is increased in value by the function of the input transistors 5 and 6 in association with the common transistor 11, thereby producing an inverting voltage signal at the node 12 with respect to the input voltage signal applied to the input node 8.

The output stage 2 has two transistors 13 of the p-channel type and 14 of the n-channel type coupled in series between the two voltage sources Vdd and Vss, and an output node 15 thereof is provided between the two transistors 13 and 14. The transistor 13 has a gate electrode tied to the node 12 of the differential amplifier input stage 1, so that the transistor 13 serves as a current driving transistor which produces a non-inverting output voltage signal at the output node 15 which varies in a symmetrical manner with respect to the inverting voltage signal at the node 12 in association with the transistor 14 of a constant current source.

The phase compensating circuit 3 is provided with a series combination of a capacitor 16 and a resistor 17 coupled between the node 12 and the output node 15, and the series combination is operative to compensate an irregular distortion in the output voltage at the node 12 due to, for example, a noise riding on the current supplied from the voltage source Vdd. The biasing circuit 4 has a series combination of a constant current source 18 and an n-channel type transistor 19 coupled between the voltage sources Vdd and Vss, and the transistor 19 has a gate electrode tied to not only the constant current source 18 but also the gate electrodes of the transistors 11 and 14 to form in combination a current mirror circuit for causing the transistors to serve as the constant current sources, respectively.

The operational amplifier circuit thus arranged produces the non-inverting output voltage signal at the output node 15 and further compensates the irregular distortion due to the fluctuation of the voltage level supplied from the constant voltage source. However, a problem is encountered in the prior-art operational amplifier circuit in undesirable distortion of the non-inverting output voltage signal in a high frequency operation due to fluctuation of the voltage level supplied from the voltage source.

Another prior-art operational amplifier circuit is disclosed by DeWitt G. ONG in pages 233 to 235 of "Modern MOS Technology: Processes, Devices, and Design" published in 1984 by McGraw-Hill Book Company. The operational amplifier circuit disclosed by DeWitt G. ONG is implemented by CMOS inverters and comprises a differential amplifier input stage and an output stage but no phase compensating circuit is incorporated.

SUMMARY OF THE INVENTION

It is therefore an important object of the present invention to provide an operational amplifier circuit which is capable of producing an output voltage similarly varied with respect to the difference in voltage level between the inverting input node and the non-inverting input node.

It is also an important object of the present invention to provide an operational amplifier circuit which is free from fluctuations of the voltage source under a high-frequency operation.

In accordance with the present invention, there is provided an operational amplifier circuit comprising (a) a differential amplifier input stage coupled between first and second voltage sources and responsive to a difference voltage applied between the two input nodes for producing an amplified signal, (b) an output stage coupled between the first and second voltage sources and responsive to the amplified signal for producing an output signal at the output node with respect to the difference voltage, (c) a phase compensating circuit coupled between the differential amplifier input stage and the output stage and operative to absorb a distortion appearing in the amplified signal to allow the output signal to similarly vary with respect to the difference voltage, (d) a biasing circuit coupled between the first and second voltage sources and operative to produce a biasing voltage signal which allows constant currents corresponding to the biasing voltage signal to flow through the differential amplifier input stage and the output stage, respectively, and (e) a phase compensation supporting circuit coupled between the differential amplifier input stage and the biasing circuit and operative to support the first phase compensating circuit for absorption of a distortion in the amplified signal under a high frequency operation. Each of the phase compensating circuit and the phase compensation supporting circuit may comprise a series combination of a capacitor and a resistor.

BRIEF DESCRIPTION OF THE DRAWINGS

The features and advantages of an operational amplifier circuit according to the present invention will be more clearly understood from the following description taken in conjunction with the accompanying drawings in which.

DESCRIPTION OF THE PREFERRED EMBODIMENT

Figure 1:
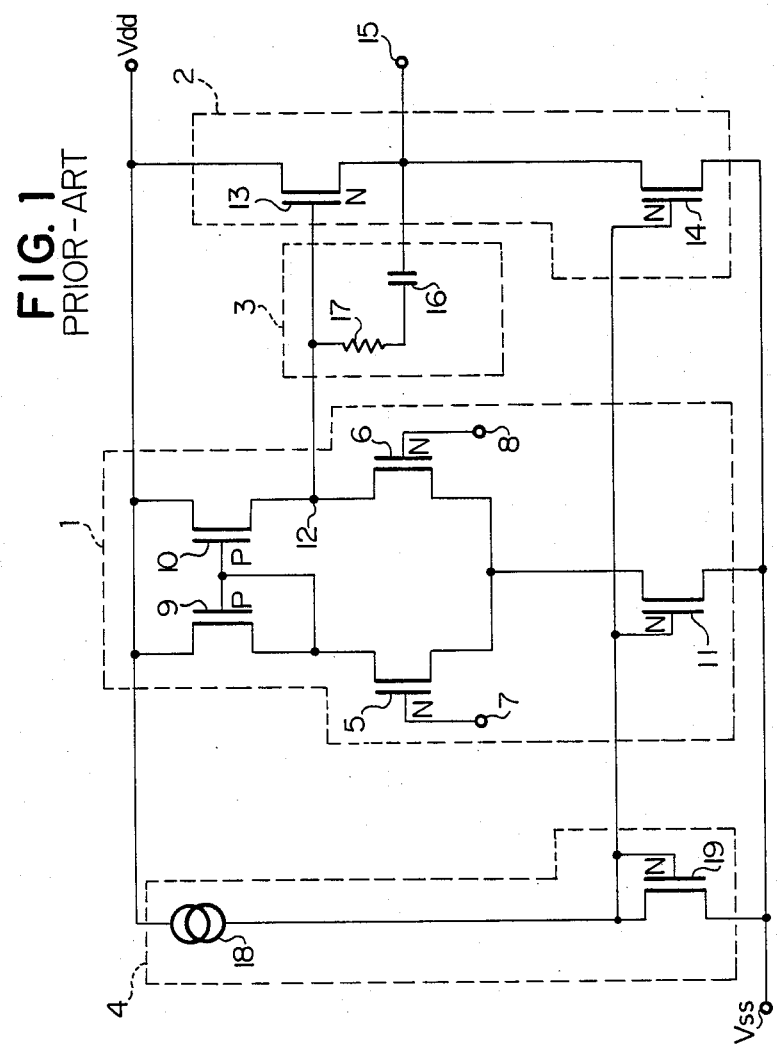
FIG. 1 is a diagram showing the circuit arrangement of a prior-art operational amplifier circuit.
Figure 2:
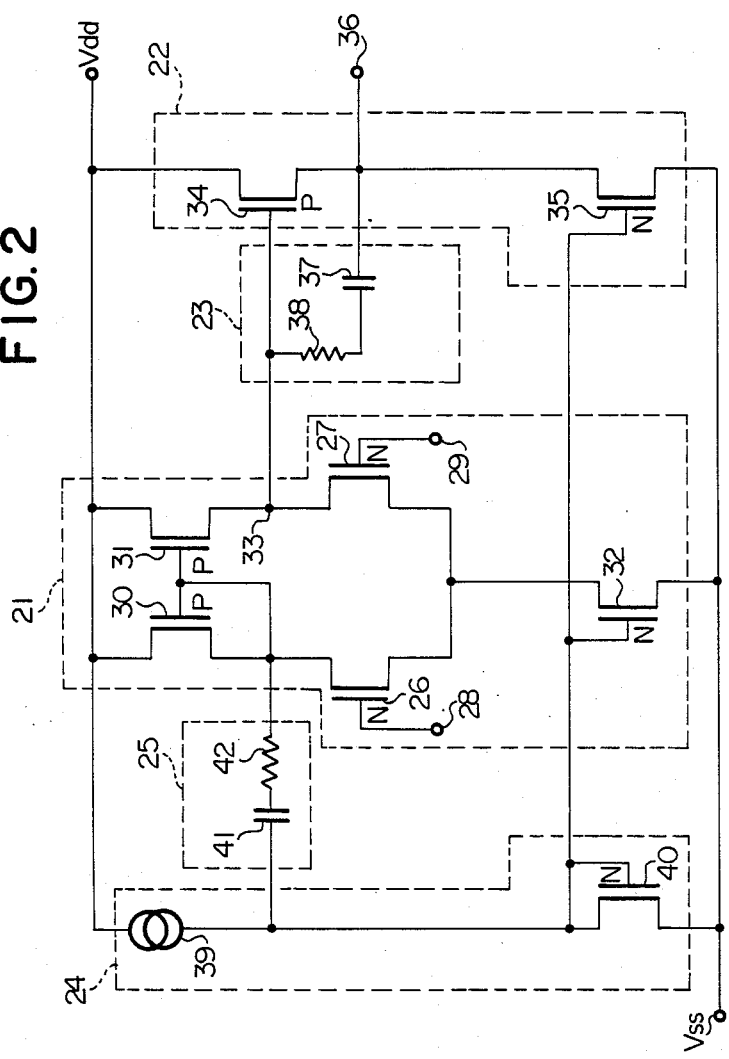
FIG. 2 is a diagram showing the circuit arrangement of an operational amplifier circuit embodying the present invention.

Referring to FIG. 2 of the drawings, a description is made for the circuit arrangement of an operational amplifier circuit embodying the present invention. The operational amplifier circuit largely comprises a differential amplifier input stage 21, an output stage 22, a phase compensating circuit 23, a biasing circuit 24 and a phase compensation supporting circuit 25. The differential amplifier input stage 21 is coupled between two voltage sources Vdd and Vss, thus producing respective voltage levels which are different in value and has a pair of input transistors 26 and 27, the gate electrodes of which are coupled to an inverting input node 28 and a non-inverting input node 29, respectively. The inverting input node 28 is supplied with a ground voltage level and an input voltage signal is applied to the non-inverting node 29. The differential amplifier input stage 1 further has two load transistors 30 and 31 coupled in parallel between the voltage source Vdd and the input transistors 26 and 27, and a current source transistor 32 coupled between the input transistors 26 and 27 and the voltage source Vss for providing a constant current corresponding to a biasing voltage signal produced by the biasing circuit 24. The input transistors 26 and 27 and the current transistor 32 are of the n-channel type but the load transistors 30 and 31 are formed by p-channel type field effect transistors, respectively. A node shared by the transistors 27 and 31 serves as an intermediate node 33. The differential amplifier input stage 21 thus arranged is responsive to a difference in voltage level between the inverting input node 28 and the non-inverting input node 29, and the difference in voltage level is increased in value by the function of the input transistors 26 and 27 in association with the current source transistor 32, thereby producing an inverting voltage signal at the intermediate node 33 with respect to the input voltage level applied to the node 29.

The output stage 22 has a current driving transistor 34 and a current source transistor 35 coupled in series between the two voltage sources Vdd and Vss, and an output node 36 thereof is provided between the two transistors 34 and 35. The current driving transistor 34 is of the p-channel type but the current source transistor 35 is of the n-channel type. The current driving transistor 34 has a gate electrode tied to the intermediate node 33, so that the transistor 34 produces a non-inverting output voltage signal varying in the similar direction to the input voltage signal. The non-inverting output voltage signal floats its voltage level with respect to the voltage level supplied from the voltage source Vdd and appears at the output node 36. On the other hand, the current source transistor 35 is responsive to the biasing voltage signal to provide a conduction path which allows a constant current corresponding to the biasing signal to flow therethrough.

The phase compensating circuit 23 is provided with a series combination of a capacitor 37 and a resistor 38 coupled between the intermediate node 33 and the output node 36, and the series combination is operative to compensate an irregular distortion in the inverting voltage signal at the intermediate node 33 due to, for example, a noise riding on the current supplied from the voltage source Vdd. In this instance, the capacitor 37 has a capacitance of about 4 pico-farads, and the resistor 38 has a resistance of about 10 kilo-ohms. However, the capacitor 37 and the resistor 38 may have a capacitance ranging between about 1 pico-farad and about 10 pico-farads and a resistance ranging between about 1 kilo-ohms and about 30 kilo-ohms, respectively.

The biasing circuit 24 has a series combination of a constant current source 39 and a load transistor 40 of the n-channel type coupled between the voltage sources Vdd and Vss, and the load transistor 40 has a gate electrode tied to not only the constant current source 39 but also the gate electrodes of the current source transistors 32 and 35. The biasing circuit 24 thus arranged is operative to produce the biasing voltage signal, and the biasing voltage signal is approximately equal in voltage level under a constant voltage level supplied from the constant voltage source Vdd. However, the biasing voltage signal is varied in voltage level upon a fluctuation of the voltage level supplied from the constant voltage source Vdd by the function of the phase compensation supporting circuit 25 as described hereinafter.

The phase compensation supporting circuit 25 comprises a series combination of a capacitor 41 and a resistor 42 coupled between the output stage 24 and the differential amplifier input stage 21. Namely, the resistor 42 is coupled at one end thereof to the constant current source 39 and the capacitor 41 is coupled to not only a common drain node of the transistors 26 and 30 but also respective gate electrodes of the load transistors 30 and 31. In this instance, the capacitor 41 has a capacitance of about 4 pico-farads, and the resistor 42 has a resistance of about 10 kilo-ohms. However, the capacitance and the resistance may range between about 1 pico-farad and about 10 pico-farads and between about 1 kilo-ohms and about 30 kilo-ohms, respectively, in another implementation. If the capacitor 37 is equal in capacitance to the capacitor 41 and the resister 38 is equal in resistance to the resistor 42, the phase compensation supporting circuit 25 achieves the most preferable circuit behaviour.

In a low-frequency operation where the non-inverting input node 28 and the inverting input node 29 are coupled to the ground voltage level and the output node 36, respectively, the differential amplifier input stage 21 is responsive to the input voltage signal to produce the inverting voltage signal. Namely, the input transistor 27 is correspondingly varied in channel conductance, and the load transistors 30 and 31 are operative to decrease the voltage level supplied from the constant voltage source Vdd by the threshold values thereof which are approximately equal to each other in this instance. Then, the inverting voltage signal at the intermediate node 33 is varied with respect to the voltage level supplied from the constant voltage level Vdd but fluctuates in the opposite direction to the input voltage signal at the non-inverting input node 29. The inverting voltage signal is transferred from the intermediate node 33 to the gate electrode of the current driving transistor 34, so that the non-inverting output voltage signal is complementally varied with respect to the inverting voltage signal. The non-inverting output voltage signal is symmetrical in waveform with the inverting voltage signal in so far as no fluctuation takes place in the voltage level supplied from the constant voltage source Vdd. One of the reasons why the fluctuations take place is that a noise rides on the current supplied from the constant voltage source Vdd. If the fluctuations take place in the voltage level supplied from the constant voltage source Vdd, the gate-drain voltage of the load transistor 31 is similarly varied, so that no fluctuation takes place between the gate-source voltage of the current driving transistor 34. However, in a high-frequency operation, the amount of current flowing through the load transistor 31 is also varied because of the fact that the capacitor 37 is decreased in impedance. Since the capacitor 41 is also decreased in impedance, the amount of current flowing into the gate electrodes of the load transistors 30 and 31 are varied to change the voltage level at the gate electrodes of the load transistors 30 and 31. This results in restriction of the variation in voltage level at the intermediate node 33. Then, the variation in voltage level at the output node 36 is also restricted. Moreover, a current flows into the biasing circuit through the capacitor 41 upon fluctuation of the voltage level at the constant voltage source Vdd, so that the biasing voltage is modified to change the amounts of the currents passing through the current source transistors 32 and 35, respectively. This is conducive to restriction of variation in voltage level at the output node 36. Thus, the variation in voltage level is improved by 25 dB in comparison with the prior-art operational amplifier circuit.

Although particular embodiments of the present invention have been shown and described, it will be obvious to those skilled in the art that various changes and modifications may be made without departing from the spirit and scope of the present invention. For example, another operational amplifier circuit is formed by using p-channel type input transistors and an n-channel type current driving transistor.

What is claimed:

1. An operational amplifier circuit having two input nodes and an output node, said amplifier circuit comprising:
   (a) a differential amplifier input stage coupled between first and second voltage sources and responsive to a difference voltage applied between said two input nodes for producing an amplified signal with respect to said difference voltage;
   (b) an output stage coupled between said first and second voltage sources and responsive to said amplified signal for producing an output signal at said output mode with respect to said difference voltage;
   (c) a phase compensating circuit coupled between said differential amplifier input stage and said output stage and operative to absorb a distortion appearing in said amplified signal to allow said output signal to similarly vary with respect to said difference voltage;
   (d) a biasing circuit coupled between said first and second voltage sources and operative to produce a biasing voltage signal which allows constant currents corresponding to the biasing voltage signal to flow through said differential amplifier input stage and said output stage, respectively; and
   (e) a phase compensation supporting circuit coupled at one end thereof to said differential amplifier input stage and at the other end thereof to said biasing circuit and operative to support said phase compensating circuit for absorption of a distortion in said amplified signal under a high frequency operation.

2. An operational amplifier circuit as set forth in claim 1, in which said differential amplifier input stage comprises a first series combination of a first load transistor and a first amplifying transistor coupled at one end thereof to said first voltage source, a second series combination of a second load transistor and a second amplifying transistor coupled at one end thereof to said first voltage source and at the other end thereof to the other end of the first series combination, a current source transistor coupled at one end thereof to the other ends of the first and second series combinations and at the other end thereof to said second voltage source and in which said first and second amplifying transistors have respective gate electrodes coupled to said input nodes, respectively, wherein said current source transistor has a gate electrode supplied with said biasing signal, said amplified signal being produced at an intermediate node provided between said first load transistor and said first amplifying transistor.

3. An operational amplifier circuit as set forth in claim 2, in which said output stage comprises a third series combination of a current driving transistor and a second current source transistor coupled between said first and second voltage sources and in which said current driving transistor has a gate electrode coupled to said intermediate node, wherein said second current source transistor has a gate electrode supplied with said biasing signal, said output node being provided between said current driving transistor and said second current source transistor.

4. An operational amplifier circuit as set forth in claim 3, in which said phase compensating circuit comprises a series combination of a first capacitor and a first resister coupled between said output node and said intermediate node.

5. An operational amplifier circuit as set forth in claim 4, in which said biasing circuit comprises a series combination of a constant current source and a third load transistor coupled between said first and second voltage sources and in which a controlling node is provided between said constant current source and said third load transistor to produce said biasing voltage signal.

6. An operational amplifier circuit having two input nodes and an output node, said amplifier circuit comprising:
   (a) a differential amplifier input stage coupled between first and second voltage sources and responsive to a difference voltage applied between said two input nodes for producing an amplified signal with respect to said difference voltage;
   (b) an output stage coupled between said first and second voltage sources and responsive to said amplified signal for producing an output signal at said output node with respect to said difference voltage;
   (c) a phase compensating circuit coupled between said differential amplifier input stage and said output stage and operative to absorb a distortion appearing in aid amplified signal to allow said output signal to similarly vary with respect to said difference voltage;
   (d) a biasing circuit coupled between said first and second voltage sources and operative to produce a biasing voltage signal which allows constant currents corresponding to the biasing voltage signal to flow through said differential amplifier input stage and said output stage, respectively; and (e) a phase compensation supporting circuit coupled between said differential amplifier input stage and said biasing circuit and operative to support said phase compensating circuit for absorption of a distortion in said amplified signal under a high frequency operation, said differential amplifier input stage comprising a first series combination of a first load transistor and a first amplifying transistor coupled at one end thereof to said first voltage source, a second series combination of a second load transistor and a second amplifying transistor coupled at one end thereof to said first voltage source and at the other end thereof to the other end of the first series combination, a current source transistor coupled at one end thereof to the other ends of the first and second series combinations and at the other end thereof to said second voltage source, said first and second amplifying transistors having respective gate electrodes coupled to said input nodes, respectively, said current source transistor having a gate electrode supplied with said biasing signal, said amplified signal being produced at an intermediate node provided between said first load transistor and said first amplifying transistor, said output stage comprising a third series combination of a current driving transistor and a second current source transistor coupled between said first and second voltage sources, said current driving transistor having a gate electrode coupled to said intermediate node, said second current source transistor having a gate electrode supplied with said biasing signal, said output node being provided between said current driving transistor and said second current source transistor, said phase compensating circuit comprising a series combination of a first capacitor and a first resistor coupled between said output node and said intermediate node, said biasing circuit comprising a series combination of a constant current source and a third load transistor coupled between said first and second voltage sources, a controlling node being provided between said constant current source and said third load transistor to produce said biasing voltage signal, said phase compensation supporting circuit comprising a series combination of a second capacitor and a second resistor coupled at one end thereof to said controlling node and at the other end thereof to respective gate electrodes of said first and second load transistors and a node between said second load transistor and said second amplifying transistor.

7. An operational amplifier circuit as set forth in claim 6, in which said first capacitor is approximately equal in capacitance to said second capacitor and in which said first resistor is approximately equal in resistance to said second resistor.

8. An operational amplifier circuit as set forth in claim 7, in which each of said first and second capacitors has a capacitance ranging between about 1 pico-farad and about 10 pico-farads.

9. An operational amplifier circuit as set forth in claim 8, in which each of said first and second capacitors has a resistance ranging between about 1 kilo-ohms and about 30 kilo-ohms.

10. An operational amplifier circuit as set forth in claim 9, in which each of said first and second capacitors and each of said first and second resistors have a capacitance of about 4 pico-farads and a resistance of about 10 kilo-ohms, respectively.

* * * * *